United States Patent [19]

Miller et al.

[11] 4,243,890
[45] Jan. 6, 1981

[54] ISOLATOR/SWITCHING ASSEMBLY FOR DATA PROCESSING TERMINAL

[76] Inventors: Bruce J. Miller, 13 Doe La., Malvern, Pa. 19355; Gus C. Gadonas, R.D. #2, Phoenixville, Pa. 19460; Frank C. Donofrio, 720 Buttonwood St., Norristown, Pa. 19401

[21] Appl. No.: 717,001

[22] Filed: Aug. 23, 1976

[51] Int. Cl.³ .................. G02B 27/00; H05K 5/00
[52] U.S. Cl. .................................. 250/551; 361/390
[58] Field of Search .................... 250/213 A, 551; 235/92 V, 92 FP; 179/179; 361/390, 331; 220/20.5; 312/223

[56] References Cited

U.S. PATENT DOCUMENTS

| | | | |
|---|---|---|---|
| 3,493,760 | 2/1970 | Hoadley | 250/551 |
| 3,629,590 | 12/1971 | Case | 250/551 |
| 3,792,208 | 2/1974 | Meyer | 250/551 |

OTHER PUBLICATIONS

Clapper et al., IBM Tech. Discl. Bul., vol. 16, No. 11, 4-1974, pp. 3523, 3524.

Primary Examiner—Stephen C. Buczinski
Attorney, Agent, or Firm—Francis A. Varallo; Leonard C. Brenner; Kevin R. Peterson

[57] ABSTRACT

The present disclosure describes an isolator/switching assembly for use in a message terminal system. The assembly permits a pair of electronic data processors, one on-line and the other a back-up unit, each processing confidential or so called "red" data, to interface with each other and both units to interface with and control a common peripheral device or I/O port. At the same time, the assembly provides physical and electrical isolation between the processor and the peripheral device and insures the TEMPEST security of the entire system.

9 Claims, 5 Drawing Figures

ISOLATOR/SWITCHING ASSEMBLY FOR DATA PROCESSING TERMINAL

CROSS REFERENCE TO RELATED APPLICATION

The technique of providing electrical isolation through the use of photoelectric means has been known for some time. One example is found in U.S. Pat. No. 3,462,606 entitled "Photoelectric Relay Using Positive Feedback" which issued on Aug. 19, 1969 in the name of Alfred L. Case. The device described and claimed in the patent is a solid state relay particularly suited for use in telegraphic and telegraph communication circuits. It is comprised of an electroluminescent diode which radiates energy to a light sensor such as silicon solar cells, the latter being connected in the claimed novel bistable transistor circuit employing positive feedback. To the extent that the present isolator/switching assembly utilizes optical coupling techniques, the aforementioned patent is referenced herein. Beyond this basic consideration, however, the present invention teaches a unique design which finds application in electronic data processing systems, as explained in the section which follows.

BACKGROUND OF THE INVENTION

Electronic data processing equipment is sometimes employed to handle confidential or classified data which is to be kept secret and protected from unauthorized disclosure. For example, TEMPEST security requires the suppression of electromagnetic (EMI) or radio frequency (RFI) signals of predetermined characteristic or frequency emanating from the processing system which may be used to gain intelligence about the classified data being processed. Assuming that the processing system must be operational substantially 100 percent of the time, it will be appreciated that any equipment malfunction requiring trouble-shooting and repair, or even routine maintenance, pose a severe problem. The opening of a processor cabinet will destroy the TEMPEST or EMI integrity, and permit the classified data to be detected by unauthorized individuals.

In the past, high isolation requirements have been achieved by relay or transformer coupling, or by expensive fiber-optic connected infrared emitters and photodetectors, occupying large areas and powered by highly isolated power supplies. Moreover, as in the referenced patent, such previously used methods interfaced only two devices or circuits and were capable of operation at comparatively low speeds.

The isolator/switching assembly of the present invention meets the desired isolation objectives in a low cost, compact unit which permits common control by two processors, a MASTER and a BACKUP unit respectively, of several devices or ports at high data rates. The processor cabinets and the secured peripherals are electrically and mechanically independent of one another and are isolated to the extent that maintenance of any device or processor may be accomplished without turning down the system or compromising the TEMPEST integrity thereof.

SUMMARY OF THE INVENTION

In accordance with the present invention, each device or peripheral channel has its own metallic isolator/switching unit or box. The latter is divided into sections, typically, but not necessarily, three in number, formed by two metal welded bulkheads within the box. Optical couplers contained in tubular metal packages are mounted in individual holes in the bulkheads. The inside diameter of each hole is substantially equal to the outside diameter of a coupler. The tight fit accomplished thereby, minimizes the presence of signals in one section of the box derived from emanations in another section. At the same time the transfer of desired signals from one section of the box to another is accomplished through the use of the optical couplers.

Assuming a three section isolator/switching box, the outer sections are hard-wired to the respective data processors. The center section receives data from the processors via the optical couplers and includes electrical circuits for performing if necessary, signal level conversions between the couplers and the peripheral device which is to receive the data. The latter device is hard-wired to the center section. The electrical circuits in this section are also utilized to convert signals coming from the output device to levels acceptable to the optical couplers, the latter transmitting the signals in common to both data processors. Software program control within the processors insures that only one of the processors applys information signals to an output device at a given time, and that both processors or only one, will respond to signals from the device. Also associated with the center section of the isolater/switching unit are DC power filters through which DC power generated by a power supply source in the assembly are made available to the aforementioned level conversion circuits.

The use of a three section isolator/switching unit with bulkhead mounted optical couplers insures complete electrical and mechanical isolation of the three sections. In the present EMI/TEMPEST secure system, all three sections or compartments would normally be handling confidential data. The isolator/switching assembly provides that any one of the three compartments' security integrity can be violated without compromising the integrity of the other compartments.

These and other features of the present invention will be more readily apparent in the detailed description appearing hereinafter.

DESCRIPTION OF THE PREFERRED EMBODIMENT

Figure 1:
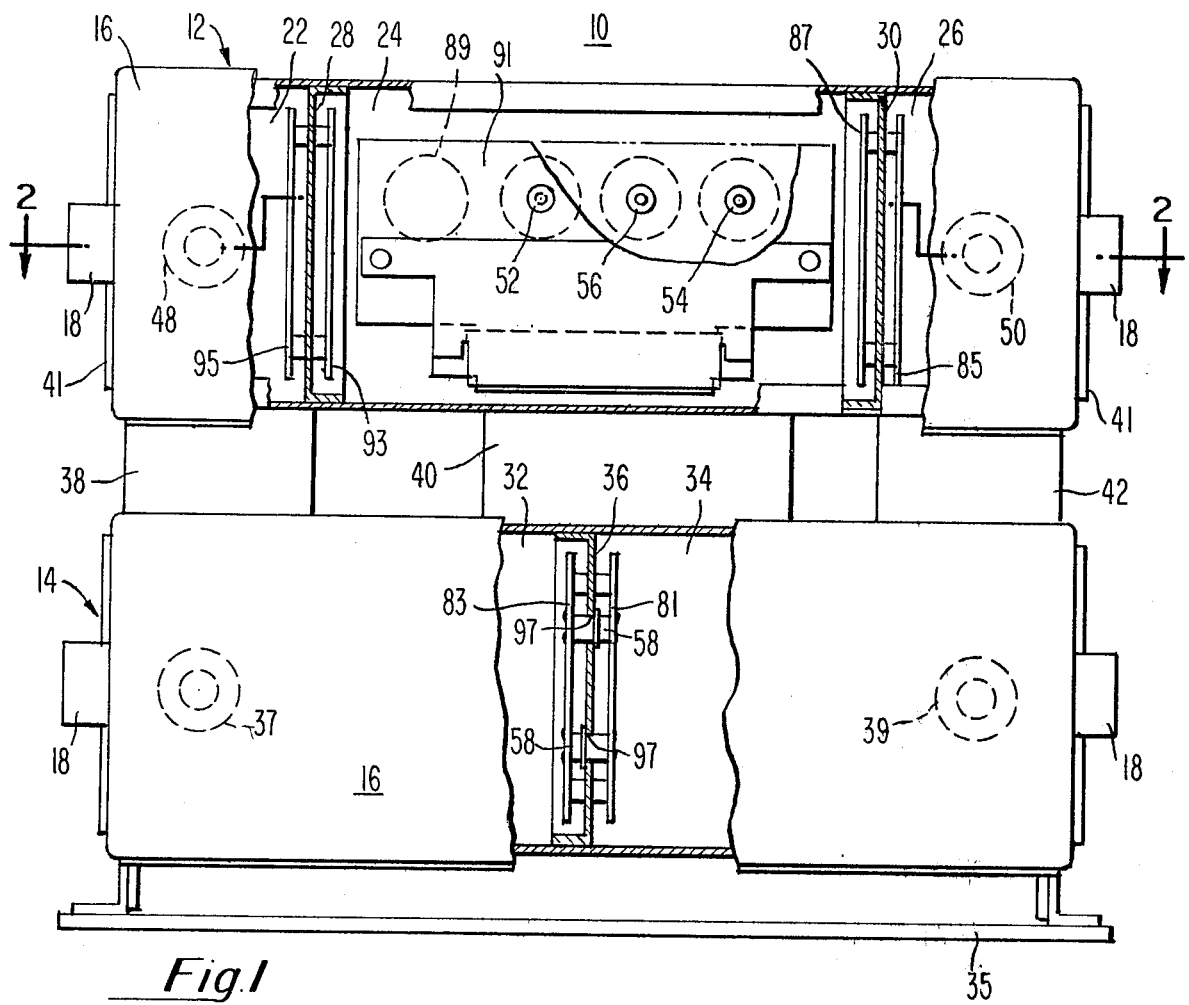
FIG. 1 is a front view of a basic isolator/switching assembly comprising a three section and a two section unit.
Figure 2:
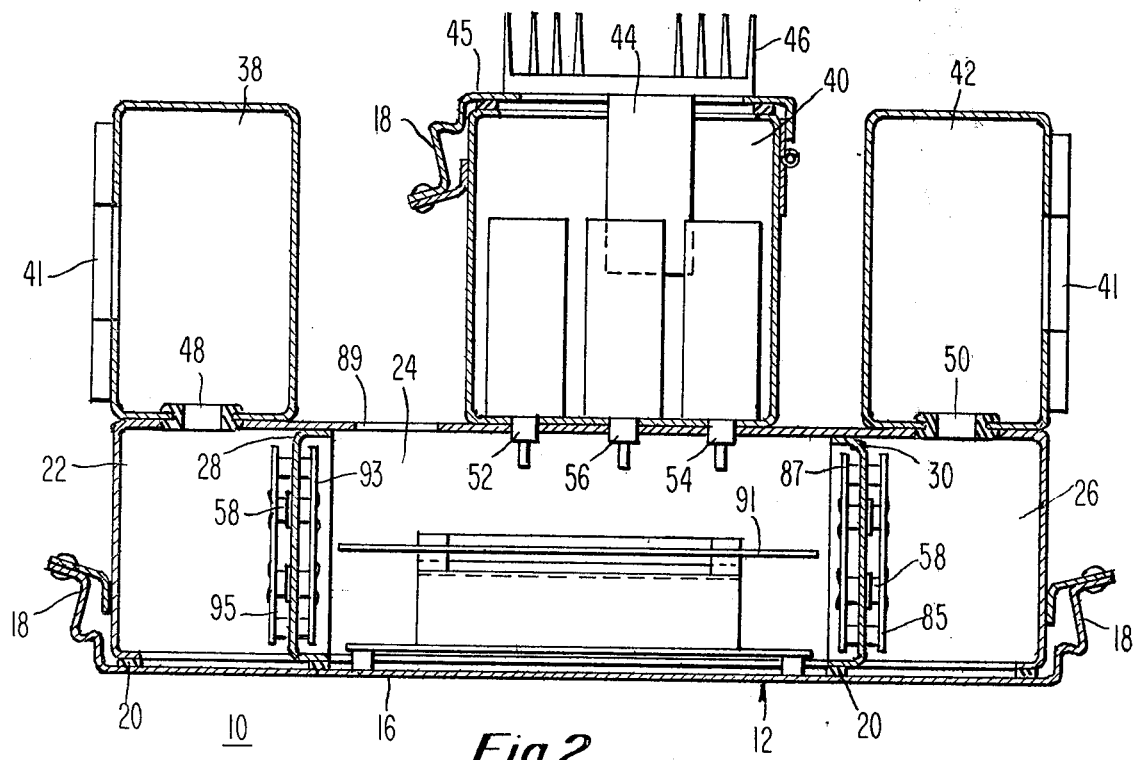
FIG. 2 is a section view taken along lines 2—2 of FIG. 1 to illustrate the additional enclosures applied to the units of FIG. 1 to form a complete assembly.
Figure 3:
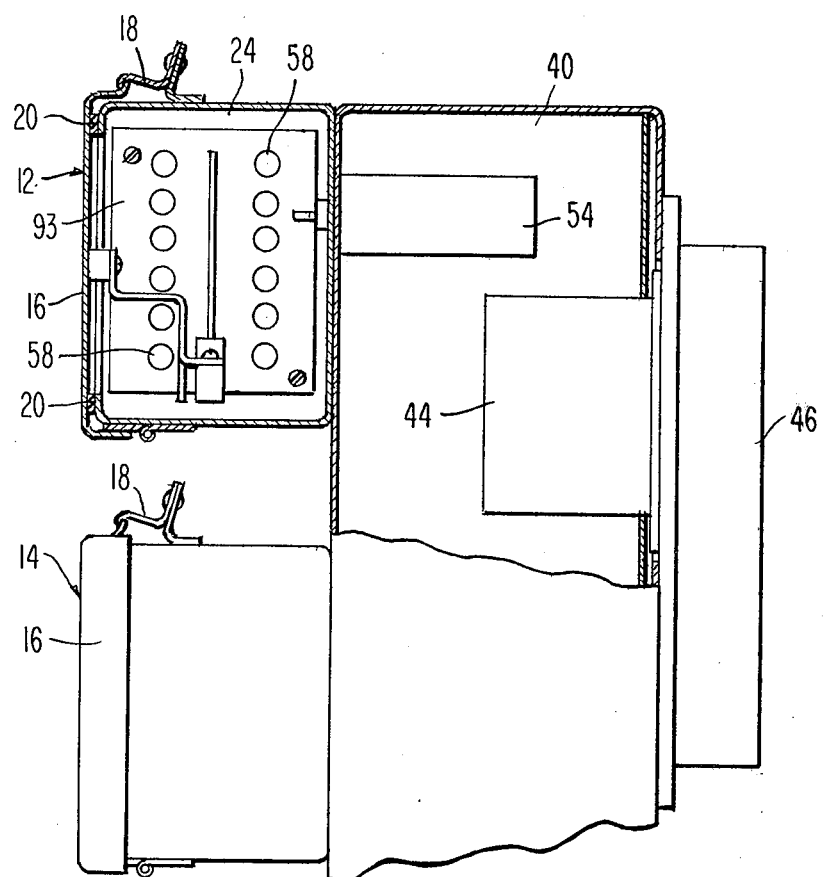
FIG. 3 is a side view of the assembly with portions cut away.

FIGS. 1-3 inclusive depict a basic isolator/switching assembly 10 comprised of a pair of metal units or boxes 12 and 14. Each of the boxes has a lid 16, hinged along one edge and adapted to be clamped shut by latching means 18. The inner periphery of the lid has a wire-mesh gasket 20 which presses against the walls of the box when the lid is clamped shut and provides for RFI/EMI suppression.

The first box 12 represents a configuration of an isolator/switching unit which is suitable to be interposed between a pair of data processors and a peripheral device. It is divided into three sections or compartments 22, 24 and 26 by two welded metal bulkheads 28 and 30. The function of the second box 14 is rather specialized in that it provides an isolated link between the two processors, in order that they may exchange data and signals on their status. The BACKUP processor is thus kept updated and is prepared to assume control if there is a malfunction of the MASTER processor. The second box 14 is divided into two sections 32 and 34 by a bulkhead 36. It should be understood that in an actual operative system, a plurality of isolator/switching units may be required, including for example, a three-section unit for each peripheral device, and a two section unit for each pair of processors. The required units are then welded onto additional metallic enclosures to form a complete assembly, mounted on a supporting member 35.

Such additional enclosures have their longitudinal axes oriented at right angles to the isolator box longitudinal axes. Thus, as seen in FIG. 2, the outer enclosures 38 and 42 are wire manifolds. The central enclosure 40 houses the DC power supply 44 with its heat sink 46. The lid 45 of the enclosure 40 is provided with latching means 18 and has a cut out portion to accommodate the power supply 44 and its heat sink 46. The outer sections 22 and 26 of box 12 have respective openings 48 and 50 into the wire manifolds 38 and 42. Similarly, the sections 32 and 34 of box 14 are provided with respective openings 37 and 39 into wire manifolds 38 and 42. The manifolds 38 and 42 each have an opening 41 through which connections are made respectively to the pair of data processors by way of ferrous conduits (not shown). Electrical conductors carrying data from or to the processor pass through the conduits, and by way of openings 41 into the manifolds, where they enter the appropriate sections of the isolator boxes via the openings 48, 50 and 37, 39.

The power supply enclosure 40 contains the circuits necessary to supply DC power to those isolator boxes which require level conversion circuits. The nature of these last circuits examples of which appear in FIGS. 4 and 5, will be considered in more detail hereinafter. For the present, it is sufficient to note that power, if required, is made available to the center section of each three section isolator unit, for example, section 24 of box 12. The DC power enters section 24 through filters 52, 54 and 56, which are generally three in number to accommodate a plus voltage, minus voltage and ground potential respectively.

The purpose of the power supply filters is to insure that if the integrity of one peripheral device or line is lost, that is, if its condition becomes "black" or nonrestricted, the power source to the other units is not compromised, and the other units may continue to process the "red" confidential information. An example of this condition occurs when servicing a peripheral printer device. If the printer cabinet is opened to replenish its paper supply, it can no longer process "red" data and since the device is hardwired to the center section of the isolator unit, that section also becomes "black". Because of the filters on the DC power supply, this condition does not propagate back to the other units using the same supply. Also as will be discussed in the following, the optical couplers prevent the "black" from propagating to either of the data processors. The terminal system can still operate and is considered on-line and functional, even when the printer is down because of maintenance or malfunction.

As depicted in FIG. 2, the bulkheads 28 and 30 of isolator unit 12 and bulkhead 36 of unit 14 have a plurality of holes 97 drilled therethrough to accommodate optical couplers or isolators 58 as they are often called. The optical couplers are well known in the art. They comprise for example a light-emitting diode (LED) and a phototransistor contained in a single package. In the present application, the optical couplers are packaged in a tubular case with the diode leads projecting from one end of the case and the phototransistor collector and emitter leads appearing at the opposite end. The outside diameter of the optical isolator package is substantially that of an aperture in the bulkhead so as to provide a tight fit and eliminate stray signal propagation. When an electrical signal is applied to the LED input, electromagnetic radiation such as visible light or infrared is emitted. The light passes through a gap or electrical nonconductive material such as glass to the input of the phototransistor, its base electrode. The phototransistor then generates an electrical signal at its output terminals, the collector-emitter circuit. The separation between the LED and phototransistor provides electrical isolation of the order of $10^{11}$ ohms.

Figure 5:
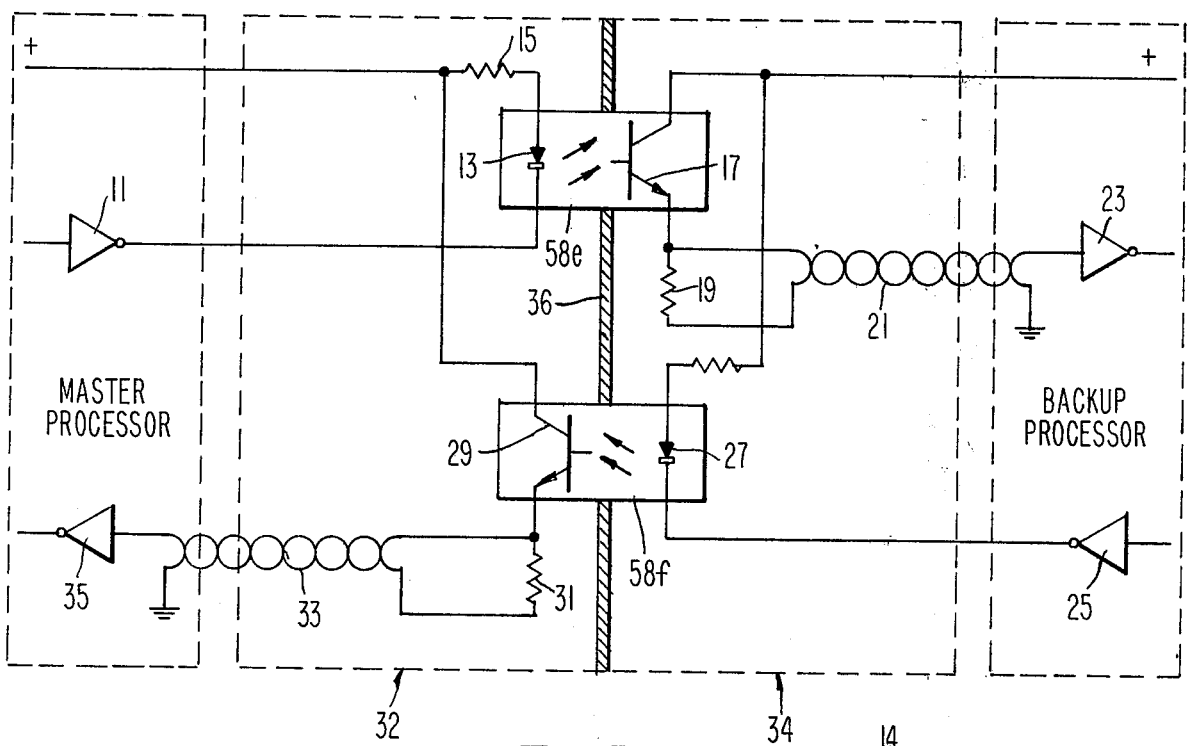
FIG. 5 is an electrical schematic of a typical interface between a pair of electronic data processors.
Figure 4:
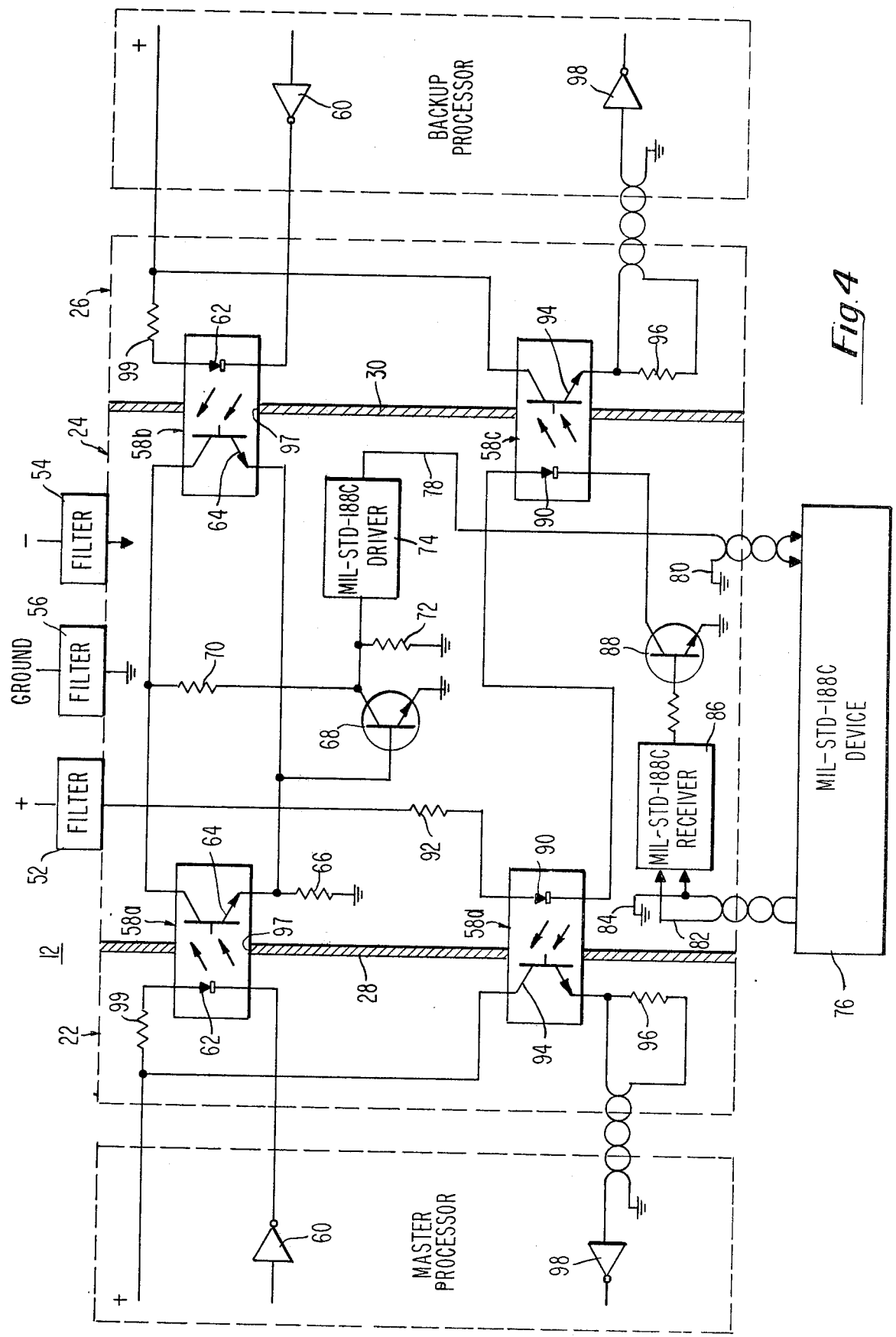
FIG. 4 is an electrical schematic of a typical interface circuit utilized for signal conversion between two data processors and a peripheral device.

It is well known that the optical coupler is not a completely efficient device. The same amount of current input to the diode is not generated in the phototransistor output circuit. In fact, the current transfer rate may be of the order of twenty percent. Therefore, it is necessary to include in the center section of the isolator unit, driver circuits to receive the output of the phototransistor and to convert it to the signal levels needed as inputs to the peripheral device. Similarly, receiver circuits in the center section of the isolator unit receive output levels of the peripheral device and convert them to signals sufficient to drive the photodiode in the optical coupler in the direction back toward the data processors. Examples of these driver and receiver circuits are illustrated in FIGS. 4 and 5 which will be described in detail hereinafter. The signals from both processors are electrically "ORed" together before being applied to the peripheral device. Also, the signals back from the device drive optical isolators in both bulkheads so that they are applied simultaneously to both processors. Software control in the MASTER and BACKUP processors insures that only one of the processors will be applying a signal to the output device at a given time. Moreover, either both processors may be instructed to receive concurrently the signal from the device or alternately, the on-line MASTER processor may accept it, while the BACKUP processor ignores it.

FIG. 4 is a schematic diagram of a typical interface circuit utilized for signal conversion and physically located in the center section 24 of unit 12, as seen in FIG. 1. This circuit, chosen for purpose of example, converts the TTL logic signal levels from the MASTER and BACKUP processors to the MIL-STD-188c voltage levels needed to drive the peripheral device, such as a high speed printer in the present application. Alternatively, the signals from the device are converted to levels suitable for driving the optical couplers.

Considering the schematic of FIG. 4, a TTL signal level from either processor, but not from both concurrently as determined by the processor software, is applied respectively via buffers 60 to the cathodes of diodes 62 of the optical couplers 58a and 58b. The anodes of diodes 62 in optical couplers 58a and 58b are coupled via resistors 99 to sources of DC potential within the respective processors. The phototransistors 64 are connected as emitter followers and have a common emitter resistor 66. The collectors of transistors 64 are coupled to a positive potential via filter 52. Conduction of either phototransistor 64 in response to the electromagnetic radiation applied to its base electrode by conduction of an associated diode, causes a voltage to be developed across resistor 66. The latter resistor accomplishes the electrical "ORing" of the processor signals mentioned hereinbefore. This last voltage is applied to the base of a transistor switch 68. The collector of transistor 68 is tied to a voltage divider comprised of resistors 70 and 72, and the voltage on the collector is applied to a MIL-STD-188c driver circuit 74. This last circuit contains the buffers and drivers necessary to generate the signal levels required as inputs by the peripheral device 76. The output of the driver circuit appears on conductor 78, which combines with a second grounded conductor 80 to form a twisted pair input to the device 76.

Signals from the MIL-STD-188c device 76 are applied to the processors in the following manner. Such signals exit the device via the twisted pair comprised of conductors 82 and 84 and enter a MIL-STD-188c circuit 86 comprised at least of a differential amplifier and buffer. The output of the receiver circuit 86 is coupled to the base of a transistor switch 88. The emitter of transistor 88 is grounded while the collector circuit includes the series connected diodes 90 of both optical couplers 58c and 58d and resistor 92. Thus, both of the last mentioned optical couplers are driven simultaneously by transistor 88. Current flow through the diodes 90 generates current flow in both phototransistors 94, and voltages are developed across the resistors 96. The latter voltages are applied to receiver circuits represented by the buffers 98 which are contained within the processor logic and which convert the signal outputs of the phototransistors to TTL levels. As noted hereinbefore, the software control in the processors may permit only the MASTER processor to accept the signal.

The DC power for the various components including the MIL-STD-188c driver 74 and receiver 86 are supplied via filters 52, 54 and 56 from the power supply 44 which is part of the isolator/switching assembly 10.

It should be noted that in FIG. 4 just described, and in FIG. 5 to be described next, the physical location of the electronic components has been indicated by rectangles which correspond to the isolator sections depicted in FIGS. 1 through 3. Thus, referring to the latter figures and to FIG. 4, the optical couplers 58a and 58d are shown mounted in apertures 97 in bulkhead 28 separating sections 22 and 24. The diode leads of opticoupler 58a, the transistor leads of opticoupler 58d, and the leads of associated resistors are terminated within section 22 on board 95 mounted on bulkhead 28 but spaced apart therefrom. Similarly, the transistor leads of optical coupler 58a, the diode leads of optical coupler 58d, and the associated resistors are connected to terminator board 93 located in section 24 of unit 12. Electrical conductors and components associated with communication to and from the peripheral device 76 are terminated on board 91 which is mounted on the lid portion of unit 12, in the central section 24 area. Wires link the board 91 to the peripheral device 76 by way of an opening 89 in the rear wall of section 24, and ferrous conduit (not shown) connected to the opening.

In like manner terminator board 87 mounted on bulkhead 30 within section 24 and board 85 on the opposite side of wall 30 within section 26 are provided. Terminator boards 93, 95 and 85, 87 have holes homologous to holes 97 in the respective bulkheads 28 and 30 to permit the optical coupler containers and/or leads to pass therethrough.

The circuit shown in FIG. 4 was chosen for purpose of illustrating how an optical coupler is driven by each processor to provide signals to the peripheral device or by the device back to the processor. Thus a total of four optical couplers are shown in FIG. 5, two associated with each processor. In an actual operative embodiment, a larger number of optical couplers are generally required to handle the interface circuits. For example, assuming that the MIL-STD-188c peripheral device in FIG. 5 is a high speed printer, the following lines from each processor to the device are required namely, (seven) DATA, PARITY, and STROBE. Lines from the device to each processor include READY and DEMAND. The total number of optical couplers to accommodate these lines is twenty-two.

FIG. 5 is a schematic of a typical processor-to-processor interface, assuming both utilze TTL logic. The isolator/switching unit 14 depicted in FIG. 1 houses the required circuits. As mentioned previously, the purpose of the data and signal status interchange between the two processors is to insure that the BACKUP processor is always capable of assuming control if a malfunction occurs in the MASTER processor.

With reference to FIG. 5, signals from the MASTER processor are coupled via buffer 11 to the cathode terminal of diode 13 in the optical coupler 58e. The anode of diode 13 is coupled via resistor 15 to a source of DC potential derived from the MASTER processor. Current flow through diode 13 activates phototransistor 17 which has its collector electrode coupled to a source of DC potential in the BACKUP processor. Current flows in its collector/emitter circuit and a voltage drop occurs across resistor 19. The voltage on this latter resistor is coupled via twisted pair 21 to a buffer receiver circuit 23 physically located in the BACKUP processor.

In similar fashion, signals from the BACKUP processor are coupled via buffer 25 to diode 27 of optical coupler 58f. The output of phototransistor 29 in optical coupler 58f appearing across resistor 31 is applied via twisted pair 33 to a buffer receiver circuit 35 in the MASTER processor, the latter circuit converting the input thereto to TTL levels.

Terminator boards 83 and 81 are shown mounted respectively on opposite sides of bulkhead 36 within sections 32 and 34 of isolator unit 14. The boards are utilized to accommodate the electrical connections of the optical couplers 58e and 58f and their associated components.

As indicated in connection with FIG. 4, the circuit interface of FIG. 5 and the associated optical couplers have been simplified for explanation purposes. In an actual embodiment, each of the processors would have six lines driving a like number of optical couplers. These lines include (two) DATA, CLOCK, FRAME, (two) STATUS, for a total of twelve optical couplers.

In conclusion, the isolator/switching assembly described herein has been used in an actual system involving two processors and commonly controlled peripheral devices. Each processor cabinet and the secured peripherals have been rendered independent of one another, both electrically and mechanically. Moreover, they are isolated to the extent that a processor or device may be opened to outside scrutiny without compromising the overall integrity of the system.

Changes and modifications of the assembly configuration described herein may be necessary to suit particular requirements. Such changes and modifications are well within the skill of the designer, and insofar as they are not departures from the true scope and spirit of the invention, are intended to be covered by the following claims.

What is claimed is:

1. An isolator/switching assebly for permitting confidential communications among a plurality of electronic data processors and a common peripheral device comprising:

at least one metal box-like isolator/switching unit having a plurality of compartments separated from each other by metal bulkheads, said unit being closed by a lid fastened to one edge thereof by hinge means and clamped to the unit by latch means engaging the other edge thereof;

a plurality of metal enclosures fastened to said unit including a plurality of wire manifolds associated respectivey with said data processors, each of said manifolds having an opening coincident with that of a first-type compartment of said unit and another opening for providing external access to the manifold in order to convey a first set of signal carrying conductors from its associated processor to said last mentioned compartment;

a second-type compartment of said unit having an opening therein for permitting the entry therethrough of a second set of signal carrying conductors coupled to said peripheral device;

a plurality of optical couplers mounted respectively in apertures formed in said bulkheads, the input leads of each coupler associated with its light source and the output leads thereof associated with its light sensor being situated on opposite sides of said bulkhead within respective adjacent compartments of said unit;

said first and second sets of signal carrying conductors being electrically coupled to predetermined leads of said optical couplers to effect communications among said processors and said common peripheral device while maintaining the electrical isolation of said compartments from one another.

2. An isolator/switching assembly as defined in claim 1 further including in said second-type compartment level conversion circuits interposed between said optical couplers and said second set of signal carrying conductors, said circuits including driver means for converting the outputs of the optical couplers to the signal levels required by the peripheral device, and receiver means for converting the output levels of said peripheral device to signals sufficient to drive said optical couplers in the direction toward said processors.

3. An isolator/switching assembly as defined in claim 2 further characterized in that said plurality of enclosures fastened to said unit includes a cabinet housing a DC power supply.

4. An isolator/switching assembly as defined in claim 3 further including a plurality of DC filters mounted in a wall of said second compartment, said DC power supply supplying DC current to said level conversion circuits via said filters.

5. An isolator/switching assembly as defined in claim 4 further characterized in that the inner surface of said lid has affixed thereto a wire mesh gasket for engaging the walls of each of the compartments when said lid is clamped shut, thereby providing for RFI/EMI suppression.

6. An isolator/switching assembly as defined in claim 5 further including a plurality of terminator boards for the interconnection of the electrical components associated with the assembly, means for mounting a pair of said boards on respective opposite sides of each bulkhead and on said lid, the last being so positioned as to lie within said second compartment when said lid is in a closed position.

7. An isolator/switching assembly as defined in claim 6 further characterized in that each of said optical couplers comprises a diode light source optically coupled to a phototransistor, each optical coupler being packaged in a tubular metal case having an outside diameter substantially equal to the aperture formed in said bulkheads so as to provide a tight fit with concomitant elimination of signal propagation from one compartment to another.

8. An isolator/switching assembly as defined in claim 7 further including at least a second isolator/switching unit solely for effecting isolated communications between said data processors, said last mentioned unit comprising a plurality of compartments associated respectively with said processors and separated from each other by metal bulkheads, a common lid for enclosing all of said compartments, each compartment having an opening for receiving signal carrying conductors from its associated processor;

a plurality of optical couplers mounted respectively in apertures formed in said bulkheads, means for coupling the information carried by the conductors associated with one processor to predetermined ones of said optical couplers for transmission to a second processor and vice-versa, said processors thereby exchanging data and status information with each other in order that any one of said processors may assume system control upon a malfunction of any of the others.

9. An isolator/switching assembly as defined in claim 8 wherein said plurality of processors consist of a MASTER and a BACKUP processor, said isolator/switching unit having three compartments and said second unit having two compartments, said plurality of enclosures consisting of a pair of wire manifolds and a power supply cabinet enclosure, said enclosures having their longitudinal axes oriented at right angles to the longitudinal axes of said units and being welded to said units to form an integral assembly.

* * * * *

UNITED STATES PATENT AND TRADEMARK OFFICE
CERTIFICATE OF CORRECTION

PATENT NO. : 4,243,890

DATED : 6 January 1981

INVENTOR(S) : Bruce J. Miller, Gus C. Gadonas, Frank C. Donofrio

It is certified that error appears in the above-identified patent and that said Letters Patent are hereby corrected as shown below:

Title/Abstract page insert:

-- Assignee: BURROUGHS CORPORATION, Detroit, Michigan --

Signed and Sealed this

Fourteenth Day of April 1981

[SEAL]

Attest:

RENE D. TEGTMEYER

Attesting Officer    Acting Commissioner of Patents and Trademarks